United States Patent [19]
Ferrant et al.

[11] Patent Number: 5,410,506
[45] Date of Patent: Apr. 25, 1995

[54] MEMORY INTEGRATED CIRCUIT WITH PROTECTION AGAINST DISTURBANCES

[75] Inventors: Richard Ferrant, Le Fontanil-Cornillon; Bruno Fel, St Martin Le Vinoux, both of France

[73] Assignee: Thomson-CSF Semiconducteurs Specifiques, Puteaux, France

[21] Appl. No.: 274,142

[22] Filed: Jul. 14, 1994

Related U.S. Application Data

[63] Continuation of Ser. No. 99,656, Jul. 30, 1993, abandoned.

[30] Foreign Application Priority Data

Aug. 13, 1992 [FR] France ................. 92 10000

[51] Int. Cl.6 .............................................. G11C 7/00
[52] U.S. Cl. ..................... 365/189.06; 365/189.02; 365/154; 365/156; 365/203; 365/205; 365/230.03
[58] Field of Search .................. 365/203, 205, 189.06, 365/230.03, 189.02, 154.156

[56] References Cited

U.S. PATENT DOCUMENTS 4,707,810 11/1987 Ferrant .
4,761,767  8/1988 Ferrant .
4,879,693 11/1989 Ferrant .
4,932,002  6/1990 Houston .............................. 365/205
5,023,841  6/1991 Akrout et al. ...................... 365/205
5,034,924  7/1991 Taniguchi et al. ............. 365/230.03
5,113,372  5/1992 Johnson .............................. 365/205

FOREIGN PATENT DOCUMENTS 0409394  1/1991 European Pat. Off. .
0416827  3/1991 European Pat. Off. .
0461430 12/1991 European Pat. Off. .

*Primary Examiner*—Joseph E. Clawson, Jr.
*Attorney, Agent, or Firm*—Oblon, Spivak, McClelland, Maier, & Neustadt

[57] ABSTRACT

Disclosed is an integrated circuit memory comprising at least one column of memory cells parallel connected with one another and connected to at least one bit line, each memory cell being connected to a bit line by at least one access transistor, wherein said memory contains a protection transistor that is connected to the bit line and controlled so as to be made conductive so as to limit the voltage drop on the bit line, during the stages of the reading of the memory, when this drop in voltage goes beyond a threshold having a value smaller than a value that prompts the writing of an information element in a memory cell.

7 Claims, 3 Drawing Sheets

MEMORY INTEGRATED CIRCUIT WITH PROTECTION AGAINST DISTURBANCES

This application is a continuation of application Ser. No. 08/099,656, filed on Jul. 30, 1993, now abandoned.

BACKGROUND OF THE INVENTION

1. Field of the Invention

The present invention relates to a memory in integrated circuit form containing a device to improve the behavior of the memory in the face of different phenomena that generate leakage currents and are liable to modify the stored information elements.

Generally, a memory comprises a network of memory cells arranged in rows and columns. The cells of a same row are connected to a same word line and the cells of a same column are connected to a same bit line which enables the reading or writing of an information element in the cell located at the intersection of this bit line and the selected word line.

For certain types of memories, notably the static memories (SRAMs), the access to each memory cell is achieved by means of transistors, for example N type MOSFET transistors. During normal operation, the transistors are on or off depending on whether the cell is selected or not. Under the effect of the different disturbances (noise on the supply voltages, the creation of electron-hole pairs by impact of heavy ions on the bit lines, irradiation etc.), normally off transistors can start conducting. During the reading phases, these disturbances may place the memory cells under conditions close to writing conditions. The state of the cell may then get inverted and the stored information is then no longer the right information. This can occur especially if a large number of cells of a column are in a given state and if the cell read is precisely in the reverse state. Indeed, in this case, the leakage currents of the access transistors to the non-selected cells add up together and modify the potentials of the bit lines in a sense that tends to reverse the state of the selected cell.

2. Description of the Prior Art

In order to overcome this drawback there are ways, known to those skilled in the art, of limiting the number of memory cells per column, the effect of which is to limit the leakage current. Certain memories then contain, for example, only 64 memory cells per column.

This is a drawback for its greatly increases the number of columns having commands that are independent of one another, and this limits the storage capacities of the memories that have to be protected against these risks of disturbance of the stored information.

SUMMARY OF THE INVENTION

Accordingly, one object of the present is a novel memory which overcomes the drawbacks of the known art.

An object of the invention is an integrated circuit memory comprising at least one column of memory cells parallel connected to at least one bit line with at least one respective access transistor to connect each memory cell to the bit line, wherein it comprises a protection transistor that is connected to the bit line and controlled so as to be made conductive when this drop in voltage goes beyond a threshold having a value smaller than a value that prompts the writing of an information element in a memory cell and so as to limit the voltage drop on the bit line during the stages of the reading of the memory.

In the case of static memories notably, there will be two complementary bit lines for each column with an access transistor to a cell for each bit line, i.e. two access transistors per cell. The protection transistor will be placed between the two complementary bit lines and the voltage drop that is to be limited will be expressed by a difference in voltage between the two complementary bit lines.

Preferably, the conduction of the transistor will be totally inhibited during the phases for the writing of information in the cells of the column so that the presence of the protection transistor does not disturb the writing by a conflict of forces.

The protection transistor will preferably be an N channel transistor with a threshold voltage of the order of one volt.

One advantage of the invention is that the maximum limit of the number of memory cells that can be connected to a same column is increased while, at the same time, high reliability of the stored information is preserved even when there are severe disturbances present.

The invention can be applied especially to static memories in which each cell is constituted by a bistable trigger circuit or flip-flop circuit connected by two respective access transistors to two complementary bit lines.

One advantage of the invention is that the maximum limit of the number of memory cells of a same column is increased.

BRIEF DESCRIPTION OF THE DRAWINGS

Other features and advantages of the invention shall appear from the description of a preferred embodiment, made with reference to the appended figures, of which.

In all the figures, the same references designate the same elements. The invention shall be described with reference to static memories for which its usefulness is the greatest.

MORE DETAILED DESCRIPTION

Figure 1:
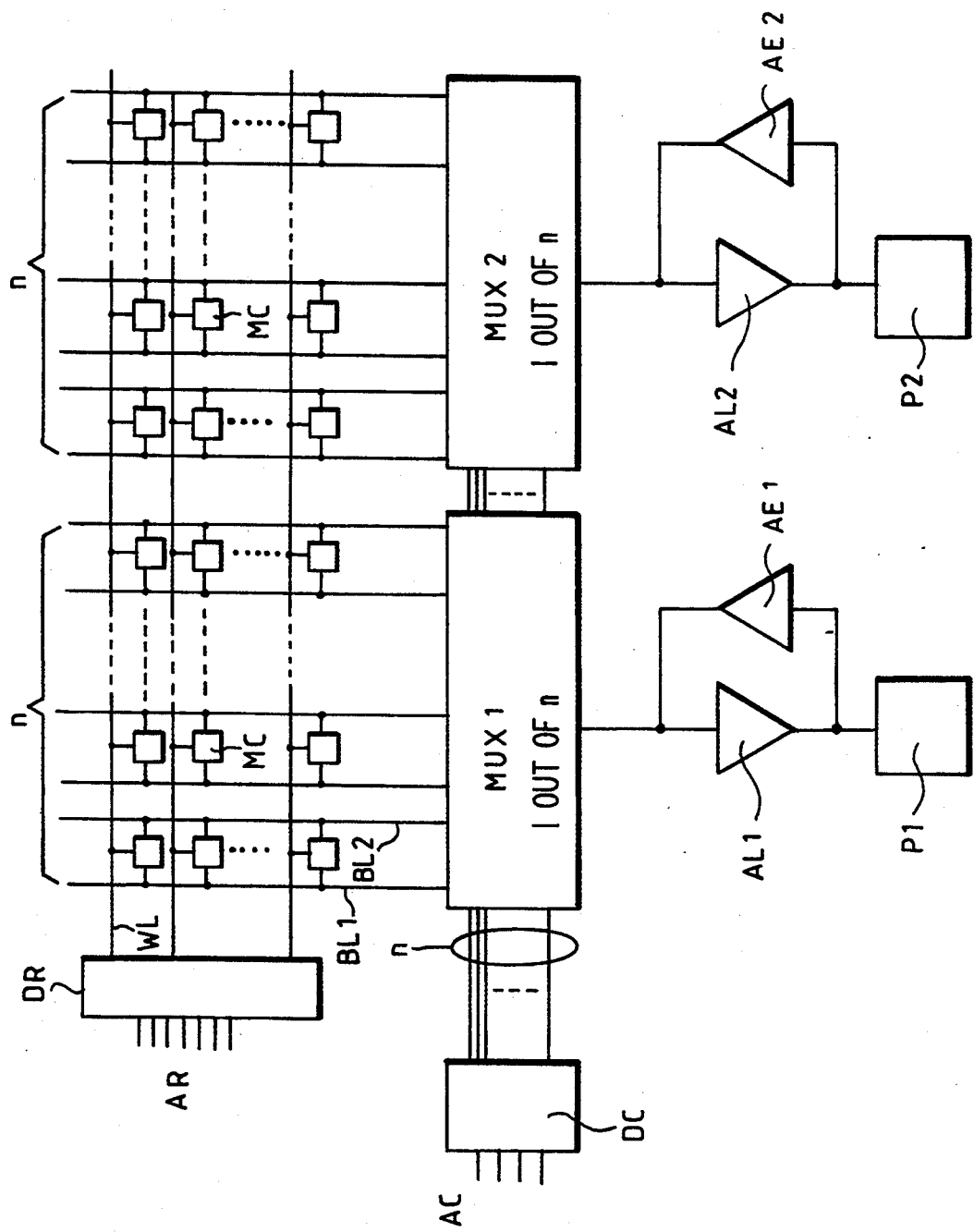
FIG. 1 shows the architecture of a standard memory according to the prior art.

FIG. 1 shows the architecture of a standard memory according to the prior art.

This memory has a network of memory cells MC arranged in rows and columns.

The cells of a same row are connected to a same word line WL coming from a row decoder DR which is used to designate one out of N rows as a function of a row address AR. The cells of a same column are connected to two complementary bit lines BL1 and BL2. The choice of a word line WL and a set of two bit lines BL1 and BL2 enables the selection of a memory cell in writing or in reading mode.

In general, the number of columns of the memory is a multiple of the number of data input/output pads of the memory. A column decoder DC receives a column address AC and controls a multiplexer. The columns are then associated by groups of n columns. These groups are juxtaposed or imbricated with one another. The multiplexer enables the selection of one out of n bit lines, in each group, and the connection of this bit line to a reading amplifier and to a writing amplifier, the amplifiers being connected to a data pad. FIG. 1 shows two groups of n columns with, respectively, two multiplexers MUX1 and MUX2, controlled simultaneously by the decoder DC, two reading amplifiers AL1 and AL2, two writing amplifiers AE1 and AE2 as well as two data pads P1 and P2.

Figure 2:
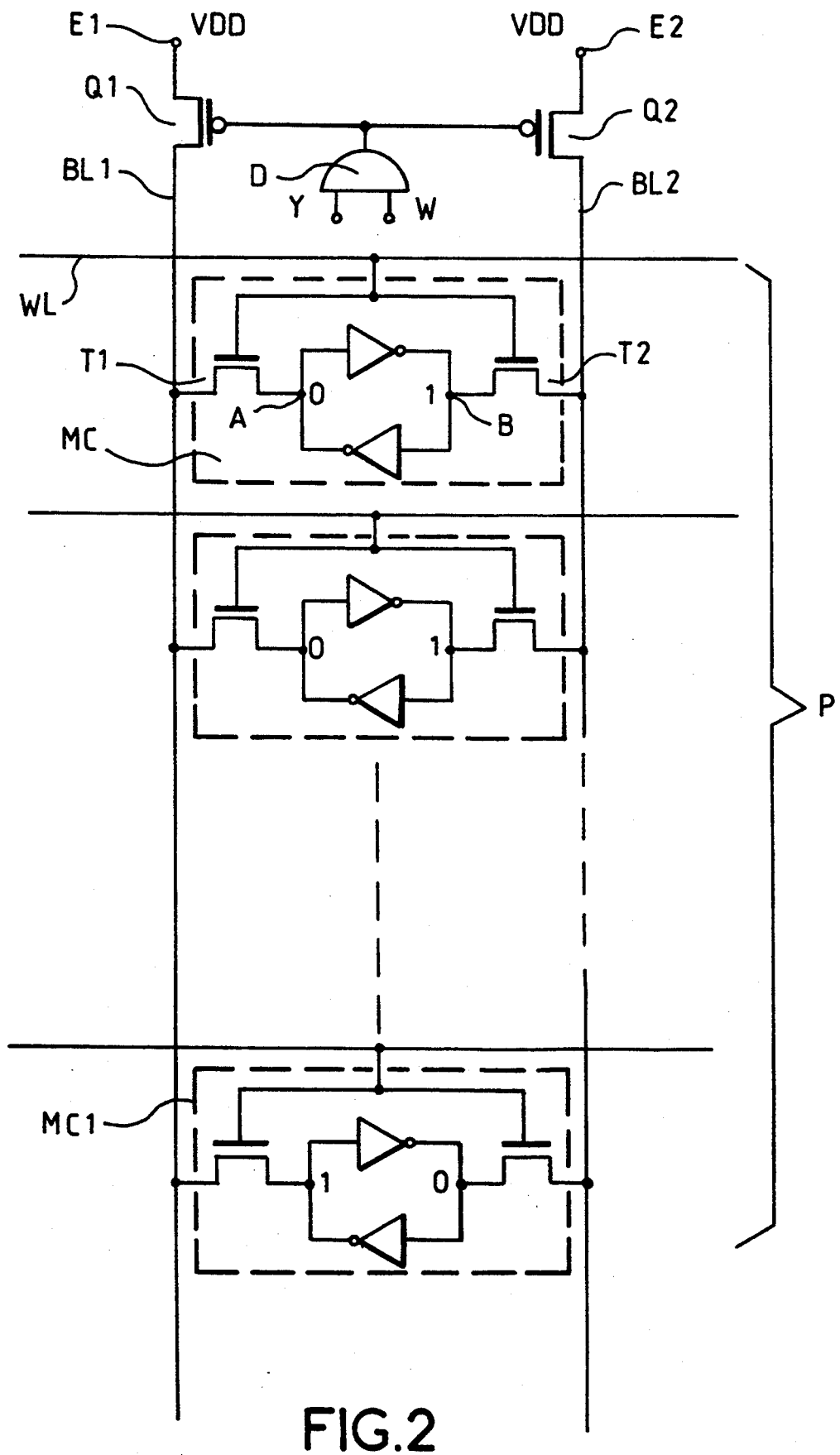
FIG. 2 shows a detailed part of the architecture described in FIG. 1.

FIG. 2 shows a detailed part of the architecture described in FIG. 1.

This figure gives a detailed view of the memory cells MC which are included in a same line between two bit lines BL1 and BL2. Each memory cell MC is constituted by a bistable trigger circuit symbolized herein by two inverters that are looped to each other. The two inverters therefore constitute a sub-assembly between two points A and B. The point A is connected to the source of a first access transistor which is an N type MOS transistor, T1, the drain of which is connected to the bit line BL1. The point B is connected to the source of a second access transistor which is an N type MOS transistor, T2, the drain of which is connected to the bit line BL2. The gates of each of the two transistors T1 and T2 are connected to each other and to a same bit line WL.

The access transistors T1 and T2 are on when it is sought to write an information element in the memory cell MC (at A or B) or when it is sought to read the information written in said cell.

The bit lines BL1 and BL2 are connected, at their respective ends E1 and E2, to the supply voltage VDD by means of load transistors Q1, Q2, herein P channel transistors which are conductive during the phases of the reading of the memory and which then behave like pull-up resistors. These transistors are represented with their control circuit which may be an AND gate, referenced D in the figure, receiving firstly a writing signal W and secondly a column selection signal Y; the transistors Q1 and Q2 are off solely during the writing of information elements in the corresponding column.

Each column contains, for example, P memory cells. To explain the invention, it shall be assumed that all the cells except one are in the same state namely, for example, 0 at A and 1 at B and a single cell MC1 is in the reverse state namely, according to the same example, 1 at A and 0 at B. This case is chosen because it provides the most unfavorable conditions in which the memories may be placed, should the above-mentioned disturbances occur.

When the memory cell MC1, which is in the reverse state with respect to the others (1 at A and 0 at B) is read, the transistors T1 and T2 of this cell are on and the transistors T1 and T2 of the other cells are off.

Under the effect of any of the above-mentioned disturbances (the creation of electron/hole pairs by impact of heavy ions on the bit lines, irradiation etc.), the transistors T1 remain logically off but have a leakage current related to the disturbance. The potential of the bit line BL1 then cannot be maintained at the supply voltage VDD. Between the two bit lines, there may then appear a differential voltage that is sufficient to reverse the state of the cell MC1 which is in reading mode and therefore has its access transistors on. The potential of the bit line BL1 gets diminished all the more as the leakage current is high. It is for this reason that, according to the prior art, the number of columns is limited for example to 64.

Figure 3:
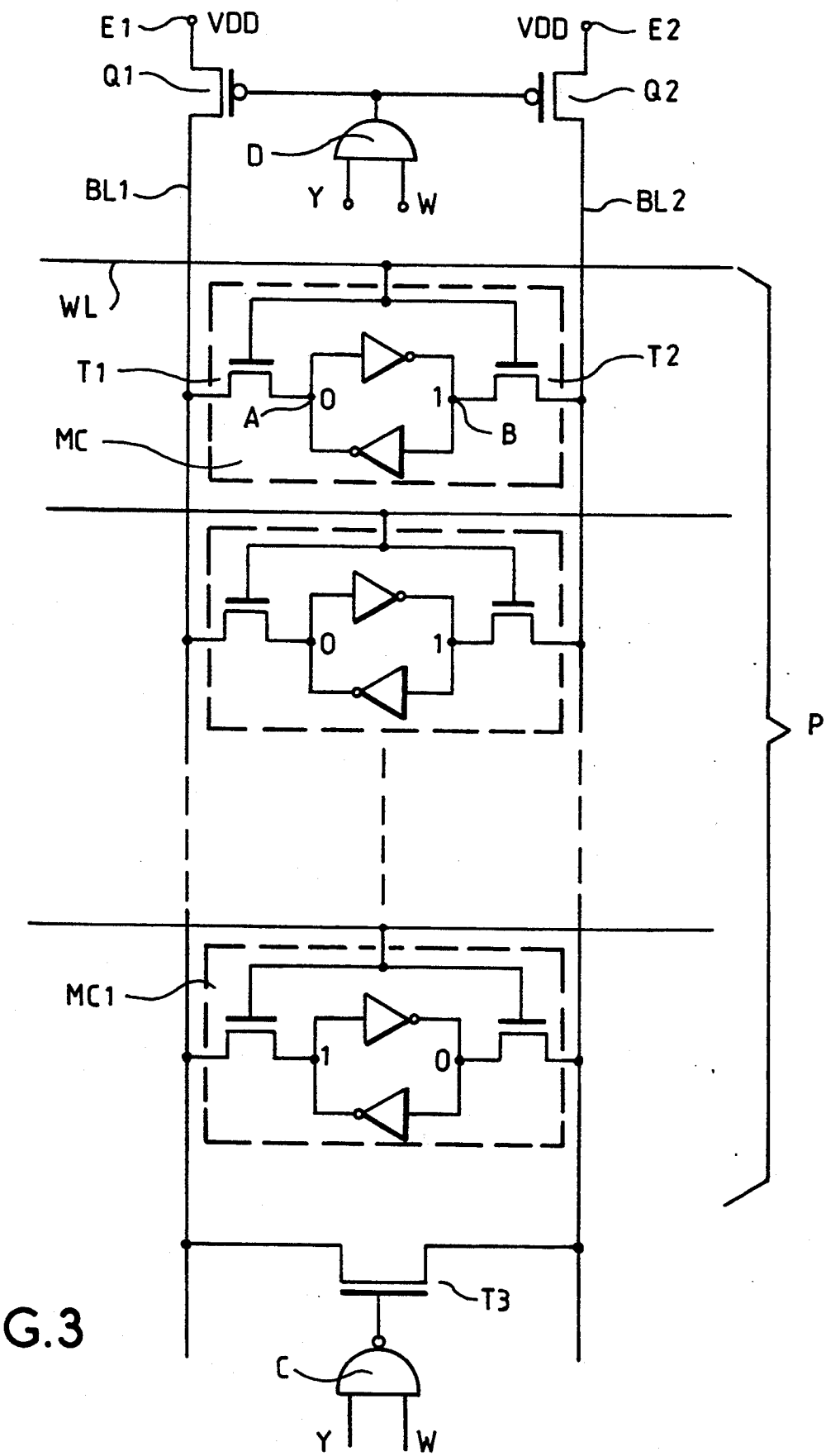
FIG. 3 shows the architecture of a memory according to the preferred embodiment of the invention.

FIG. 3 shows the architecture of a memory according to the preferred embodiment of the invention.

This figure shows only one column of memory cells between two bit lines, exactly as is the case with what has been described with reference to FIG. 2. It is clear that, in a complete memory, the invention relates to each of the columns of memory cells contained between two bit lines.

The device according to the invention is constituted by a protection transistor T3 whose drain is connected to the bit line BL1 and whose source is connected to the bit line BL2. In the example shown, the gate of this transistor is connected to the output of a NAND circuit C. Of the two inputs of this NAND circuit C, one is connected to a writing command W and the other to a command Y for the selection of the column considered. The transistor T3 is preferably an N type MOS transistor similar to the other N channel transistors of the memory.

During the reading stages, the gate of the transistor T3 is taken to a potential close to the supply VDD. The result thereof is that the transistor becomes conductive as soon as the voltage on one of the bit lines falls below a value equal to VDD minus VT where VT is the threshold voltage of the transistor T3. In a standard way, this voltage is of the order of 1 volt. Consequently, even if we take the most unfavorable case mentioned here above (all the cells in the reverse state of the cell MC1 that is being read), the voltage difference between the lines BL1 and BL2 cannot go beyond the voltage VT and this voltage is not enough to change over the state of the cell MC1. In normal operation (without disturbances), the transistor T3 does not disturb the reading for a difference of some tens of millivolts between the lines BL1 and BL2 is enough to detect the state of a cell.

Preferably, the transistor T3 is off during the writing of the data elements in any one of the memory cells of the column. This is the role of the circuit C. The control of the gate of the transistor T3 is indeed at the level 0 since the commands for the writing and decoding of the column are at the level 1. Provision can also be made for the transistor T3 to be switched off by the command W only, i.e. simultaneously for all the columns during the writing phases.

In every other case, such as that of reading or the so-called standby position, the transistor T3 is activated for its gate voltage is at the level 1. According to the invention, the transistor T3 is chosen firstly so as to enable the removal of charges between bit lines and secondly to prevent the appearance, between bit lines, of a differential voltage sufficient to erase the cell that is being read.

A criterion of choice of the transistor T3 is its threshold voltage VT or gate/source voltage above which it is on. This voltage is chosen at a sufficiently low level so that this same transistor conducts swiftly during the disturbance that generates leakage currents. For example, according to a preferred embodiment of the invention, a voltage VT of 800 millivolts is needed to ensure the conduction of T3 while 100 to 200 volts of differential voltage between bit lines are sufficient to read a cell.

According to the invention, the transistor T3 preferably has its substrate grounded in order to reduce parasitic noises.

As mentioned earlier, an advantage of the invention is that it does not limit the number of memory cells in a column.

Another advantage of the invention is that it is not conditioned by any particular technology.

It will be noted that the implementation of the invention does not increase the bulk of the circuit for, in practice, the transistor T3 may be located beneath the supply bus of the circuit that generally surrounds the entire memory map.

Another advantage of the invention therefore is the fact that it is easy to implement.

What is claimed is:

1. An integrated circuit memory comprising:
   at least one column of memory cells to which data is written and from which data is read connected in parallel with one another and connected to at least one bit-line;
   at least one access transistor connecting each memory cell to the at least one bit line;
   a protection transistor connected to the at least one bit-line;
   a control circuit, connected to a gate of said protection transistor so as to turn said protection transistor on when, under an effect of a disturbance, a voltage on at least one bit-line falls below a predetermined threshold during reading of data from at least one of the memory cells.

2. A memory according to claim 1, wherein each column of memory cells is connected to two bit lines, and wherein the protection transistor is connected in parallel with said memory cells to connect the two bit lines.

3. An integrated circuit memory according to claim 2, wherein said protection transistor is an N type MOS transistor that connects the two bit lines in such a way that its drain is connected to a first bit-line and its source to a second bit-line, and wherein the control circuit is a NAND circuit having its output connected to a gate of said protection transistor, a first input connected to a writing command of the integrated circuit memory and a second input connected to a column-selection command.

4. An integrated circuit memory according to claim 3, wherein said protection transistor becomes conductive when a voltage between its drain and its source is equal to a threshold voltage of said protection transistor.

5. An integrated circuit memory according to any one of claims 1 to 4, wherein said control circuit enables said protection transistor to be turned off during writing of data into the memory cells.

6. A memory according to claim 1, wherein the memory cells are bistable trigger circuits.

7. A memory according to claim 1, wherein the access transistors are N type MOS transistors.

* * * * *